US011990317B2

(12) United States Patent
Hasegawa

(10) Patent No.: US 11,990,317 B2
(45) Date of Patent: May 21, 2024

(54) HIGH-FREQUENCY POWER SUPPLY SYSTEM

(71) Applicant: DAIHEN CORPORATION, Osaka (JP)

(72) Inventor: Yuichi Hasegawa, Osaka (JP)

(73) Assignee: DAIHEN CORPORATION, Osaka-Fu (JP)

( * ) Notice: Subject to any disclaimer, the term of this patent is extended or adjusted under 35 U.S.C. 154(b) by 9 days.

(21) Appl. No.: 18/086,406

(22) Filed: Dec. 21, 2022

(65) Prior Publication Data

US 2023/0207264 A1 Jun. 29, 2023

(30) Foreign Application Priority Data

Dec. 28, 2021 (JP) ................................. 2021-214221

(51) Int. Cl.
*H01J 37/32* (2006.01)

(52) U.S. Cl.
CPC .. *H01J 37/32165* (2013.01); *H01J 37/32183* (2013.01); *H01J 2237/327* (2013.01)

(58) Field of Classification Search
CPC ........... H01J 37/32165; H01J 37/32183; H01J 2237/327; H01J 37/32174
See application file for complete search history.

(56) References Cited

U.S. PATENT DOCUMENTS 9,030,101 B2 5/2015 Valcore, Jr. et al.
9,114,666 B2 8/2015 Valcore, Jr. et al.
9,171,699 B2 10/2015 Valcore, Jr. et al.
9,197,196 B2 11/2015 Valcore, Jr. et al.
9,236,228 B2 1/2016 Valcore, Jr. et al.
9,295,148 B2 3/2016 Fong et al.
9,320,126 B2 4/2016 Valcore, Jr. et al.
9,337,000 B2 5/2016 Marakhtanov et al.
9,368,329 B2 6/2016 Valcore, Jr. et al.
9,390,893 B2 7/2016 Valcore, Jr. et al.
9,401,264 B2 7/2016 Marakhtanov et al.
(Continued)

FOREIGN PATENT DOCUMENTS

JP H07-74159 A 3/1995
JP 2017-188434 A 10/2017
JP 2018-536295 A 12/2018

*Primary Examiner* — Jared Fureman
*Assistant Examiner* — Michael J Warmflash
(74) *Attorney, Agent, or Firm* — Crowell & Moring LLP

(57) ABSTRACT

To simplify a process of suppressing an increase in a reflected wave power caused by IMD, provided is a high-frequency power supply system for providing a high-frequency power to a load, including: a first power supply for supplying a first high-frequency power to the load; a second power supply for supplying a second high-frequency power to the load; and a matching device. The matching device provides a system clock to each of the first power supply and the second power supply. The second power supply outputs a second high-frequency voltage at a control period determined based on the system clock provided from the matching device. The first power supply outputs a first high-frequency voltage obtained by frequency modulation of a fundamental wave signal having a first fundamental frequency and through amplification, in each control period determined based on the system clock provided from the matching device.

3 Claims, 7 Drawing Sheets

(56) References Cited

U.S. PATENT DOCUMENTS

| | | | |
|---|---|---|---|
| 9,462,672 B2 | 10/2016 | Valcore, Jr. et al. | |
| 9,502,216 B2 | 11/2016 | Valcore, Jr. et al. | |
| 9,530,620 B2 | 12/2016 | Valcore, Jr. et al. | |
| 9,607,810 B2 | 3/2017 | Valcore, Jr. et al. | |
| 9,620,334 B2 | 4/2017 | Lyndaker et al. | |
| 9,620,337 B2 | 4/2017 | Valcore, Jr. et al. | |
| 9,711,332 B2 | 7/2017 | Howald et al. | |
| 9,720,022 B2 | 8/2017 | Howald et al. | |
| 9,779,196 B2 * | 10/2017 | Valcore, Jr. ............. | G06F 30/36 |
| 9,812,294 B2 | 11/2017 | Valcore, Jr. et al. | |
| 9,831,065 B2 | 11/2017 | Fong et al. | |
| 9,831,071 B2 | 11/2017 | Howald et al. | |
| 9,837,252 B2 | 12/2017 | Howald et al. | |
| 9,842,725 B2 | 12/2017 | Valcore, Jr. et al. | |
| 9,947,514 B2 * | 4/2018 | Radomski ......... | H01J 37/32183 |
| 9,960,015 B2 | 5/2018 | Valcore, Jr. et al. | |
| 9,997,333 B2 | 6/2018 | Valcore, Jr. et al. | |
| 10,008,371 B2 | 6/2018 | Valcore, Jr. et al. | |
| 10,032,605 B2 | 7/2018 | Valcore, Jr. et al. | |
| 10,074,520 B2 | 9/2018 | Valcore, Jr. et al. | |
| 10,128,090 B2 | 11/2018 | Valcore, Jr. et al. | |
| 10,157,729 B2 * | 12/2018 | Valcore, Jr. ....... | H01J 37/32082 |
| 10,157,730 B2 | 12/2018 | Marakhtanov et al. | |
| 10,163,605 B2 | 12/2018 | Fong et al. | |
| 10,231,321 B2 | 3/2019 | Valcore, Jr. et al. | |
| 10,249,476 B2 | 4/2019 | Marakhtanov et al. | |
| 10,256,077 B2 | 4/2019 | Valcore, Jr. et al. | |
| 10,276,350 B2 | 4/2019 | Howald et al. | |
| 10,296,676 B2 | 5/2019 | Howald et al. | |
| 10,304,669 B1 | 5/2019 | Coumou et al. | |
| 10,319,570 B2 | 6/2019 | Valcore, Jr. et al. | |
| 10,325,759 B2 * | 6/2019 | Valcore, Jr. ....... | H01J 37/32935 |
| 10,340,127 B2 | 7/2019 | Valcore, Jr. et al. | |
| 10,381,201 B2 | 8/2019 | Lyndaker et al. | |
| 10,403,482 B2 | 9/2019 | Howald et al. | |
| 10,469,108 B2 * | 11/2019 | Howald ................. | G05B 17/02 |
| 10,474,780 B2 | 11/2019 | Valcore, Jr. et al. | |
| 10,621,265 B2 | 4/2020 | Howald et al. | |
| 10,629,413 B2 | 4/2020 | Valcore, Jr. et al. | |
| 10,707,056 B2 | 7/2020 | Valcore, Jr. et al. | |
| 10,748,748 B2 | 8/2020 | Valcore, Jr. et al. | |
| 10,762,266 B2 | 9/2020 | Valcore, Jr. et al. | |
| 10,853,444 B2 | 12/2020 | Howald et al. | |
| 10,911,081 B2 | 2/2021 | Howald et al. | |
| 11,361,942 B2 | 6/2022 | Valcore, Jr. et al. | |
| 2015/0096684 A1 * | 4/2015 | Nagami ............ | H01J 37/32174<br>156/345.28 |
| 2015/0122421 A1 * | 5/2015 | Konno .............. | H01J 37/32183<br>156/345.28 |
| 2016/0268100 A1 | 9/2016 | Valcore, Jr. et al. | |
| 2017/0062187 A1 | 3/2017 | Radomski et al. | |
| 2018/0323038 A1 | 11/2018 | Valcore, Jr. et al. | |
| 2019/0318919 A1 | 10/2019 | Lyndaker et al. | |
| 2023/0207263 A1 * | 6/2023 | Hasegawa ......... | H01J 37/32146<br>327/540 |
| 2023/0207270 A1 * | 6/2023 | Hasegawa ......... | H01J 37/32183<br>315/111.21 |

* cited by examiner

Impedance locus before IMD suppression

Impedance locus after IMD suppression

HIGH-FREQUENCY POWER SUPPLY SYSTEM

CROSS REFERENCE TO RELATED APPLICATIONS

The present application claims priority from Japanese patent application JP 2021-214221 filed on Dec. 28, 2021, the entire content of which is hereby incorporated by reference into this application.

BACKGROUND

Technical Field

The present invention relates to a high-frequency power supply system.

Background Art

In the field of semiconductor manufacturing, as electronic equipment has become smaller and more functional, there is a need for higher-density mounting. Connections of elements to a mounting substrate have become miniaturized, and mounting needs to be performed with ever higher reliability.

One of the ways in which mounting reliability can be ensured is by surface modification using plasma. For example, when a substrate to be processed is subjected to plasma processing, it is possible to remove contamination due to organic matter attached to the surface of the substrate, to increase the bonding strength of wire bonding, to improve wettability, and to improve adhesion between the substrate and sealing resin. In order to perform such plasma processing, a power supply device needs to be connected to a plasma reactor apparatus.

For example, JP H07-74159 A discloses a configuration example of a power supply device connected to a plasma reactor apparatus. Specifically, JP H07-74159 A discloses a configuration in which a high-frequency (source) power supply and a low-frequency (bias) power supply are superimposed with each other via a matching circuit to supply power to the plasma reactor apparatus. In the matching circuit, impedance matching is achieved between the power supply side and the plasma reactance device side to achieve efficient supply of power.

SUMMARY

When a dual-frequency power supply is provided, as discussed in JP H07-74159 A, it is known that a plasma sheath is generated in the plasma chamber of the plasma reactor apparatus, together with a plasma. Generally, the plasma sheath may be considered to be electrically insulated, and it may be considered that a virtual capacitor is formed between the electrodes of the plasma chamber. Because the location of the plasma varies in conjunction with periodic changes in the voltage of the low frequency (bias) power supply, the capacitance of the plasma sheath also varies periodically (for example, with a period corresponding to, or twice, the bias frequency, depending on the structure of the plasma chamber). That is, the plasma impedance varies rapidly due to changes in the voltage of the bias power supply.

However, because an impedance variable element of a matching device is typically operated by a motor, the matching operation may not be able to follow the fast change in plasma impedance. As a result, the reflected wave power that feeds back to the output end of the source power supply may increase due to inter-modulation distortion (IMD). An increase in the reflected wave power may prevent efficient and accurate supply of power to the load side. Thus, the IMD needs to be reduced.

In this respect, JP 2018-536295 A and JP 2017-188434 A disclose techniques wherein, in a period of a low-frequency side (LF) power supply, a phase (frequency) and power of a high-frequency side (HF) power supply such that the reflected wave can be reduced are determined based on an impedance computed in a high-speed and divided manner and a frequency/matching section look-up table, and the HF is controlled to operate in accordance with a trigger signal from the LF.

According to the techniques disclosed in JP 2018-536295 A and JP 2017-188434 A, however, the high-frequency side (HF) power supply or the impedance matching device controls the phase or power through frequency offset adjustment or impedance computation in accordance with the trigger signal from the low-frequency side (LF) power supply to reduce the IMD. In such a case, the high-frequency side power supply (HF) or the impedance matching device requires a synchronization signal for synchronization with the period of the LF power supply and, when the synchronization is not achieved, may not be able to correctly perform the offset adjustment or impedance computation, and the reflected wave power may not be reduced sufficiently.

In view of the above circumstances, the present disclosure proposes techniques for preventing an out-of-sync condition in frequency modulation control for IMD suppression.

In view of the foregoing, the present disclosure provides a high-frequency power supply system for providing a high-frequency power to a connected load, the system including: a first power supply configured to output a first high-frequency voltage having a first fundamental frequency so as to supply a first high-frequency power to the load; a second power supply configured to output a second high-frequency voltage having a second fundamental frequency that is lower than the first fundamental frequency so as to supply a second high-frequency power to the load; and a matching device including a first matching part connected between the first power supply and the load and a second matching part connected between the second power supply and the load. The matching device provides a system clock to each of the first power supply and the second power supply. The second power supply outputs a second high-frequency voltage at a control period determined based on the system clock provided from the matching device. The first power supply outputs a first high-frequency voltage obtained by frequency modulation of a fundamental wave signal having a first fundamental frequency and through amplification, in each control period determined based on the system clock provided from the matching device.

Further features relating to the present disclosure will become apparent from the following descriptions and the attached drawings. Aspects of the present disclosure may be achieved or implemented by various elements and various combinations of such elements, as well as by the following detailed description and the appended claims.

It should be understood that the descriptions that follow are for exemplary purposes only, and do not in any way represent a limitation of the scope of the claims or application examples.

According to the techniques of the present disclosure, a common system clock is provided from the matching device to the first power supply and the second power supply. This allows a timing of frequency modulation control in the first power supply to be synchronous with a second frequency. Thus, the techniques of the present disclosure have no adverse effect caused by the system clock in the first power supply being out of synchronization with the system clock in the second power supply, and can perform accurate frequency modulation control.

DETAILED DESCRIPTION

In the following, an embodiment of the present disclosure will be described with reference to the attached drawings. In the attached drawings, functionally identical elements may be designated with identical numerals. The attached drawings illustrate concrete embodiments and implementation examples in accordance with the principles of the present disclosure. However, these are provided to assist an understanding of the present disclosure and should not be construed as limiting the present disclosure.

While the embodiment is described in sufficient detail to enable a person skilled in the art to practice the present disclosure, it will be understood that other implementations or embodiments are also possible, and that various changes to configurations or structures and various substitutions of elements may be made without departing from the scope and spirit of the technical concepts of the present disclosure. Accordingly, the following descriptions are not to be interpreted in a limiting sense.

Furthermore, the embodiment of the present disclosure may be implemented using software running on a general-purpose computer, or may be implemented using dedicated hardware or in a combination of software and hardware.

<Configuration Example of Power Supply System 1>

Figure 1:
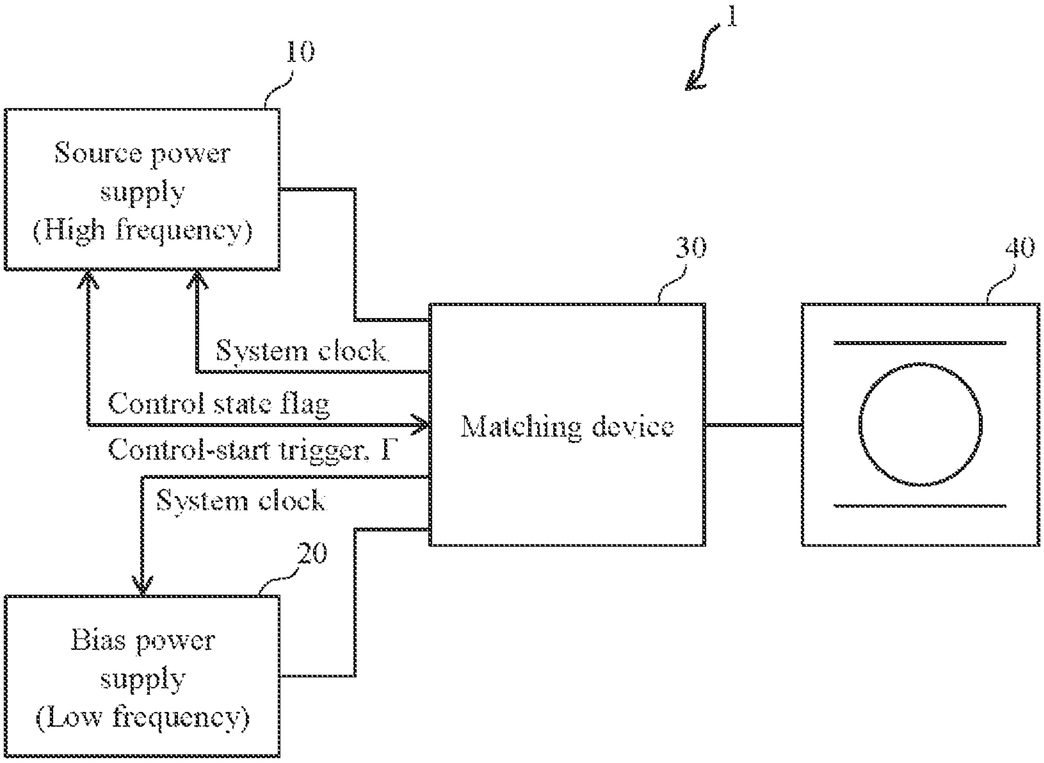
FIG. 1 illustrates a state in which a plasma load 40 is connected to a power supply system (also referred to as a high-frequency power supply system) 1 according to the present embodiment.

FIG. 1 illustrates a state in which a plasma load 40 is connected to a power supply system (also referred to as a high-frequency power supply system) 1 according to the present embodiment. The power supply system 1 includes a source power supply (first power supply) 10, a bias power supply second power supply) 20, and a matching device (also referred to as an impedance convertor) 30 to which an output is supplied from each of the source power supply 10 and the bias power supply 20, and which provides impedance matching between the side of the source power supply 10 and the bias power supply 20 and the side of the plasma load 40. The power supply system 1 provides the plasma load 40 with a high-frequency power (source power) output from the source power supply 10 and a high-frequency power (bias power) output from the bias power supply 20 in a superimposed manner, for example.

It should be noted that the source power supply 10 outputs a first high-frequency voltage (forward wave voltage) having a first fundamental frequency (for example, 40.68 MHz) so as to supply a first high-frequency power (forward wave power) to a load. The bias power supply 20 outputs a second high-frequency voltage (forward wave voltage) having a second fundamental frequency (for example, 400 kHz) (first fundamental frequency>second fundamental frequency) so as to supply a second high-frequency power (forward wave power) to the load.

The matching device 30 provides a system clock to each of the source power supply 10 and the bias power supply. The matching device 30 also provides a control-start trigger as a timing for starting a frequency modulation operation (i.e., operation for reducing IMD) and a calculated reflection coefficient Γ to the source power supply 10. The source power supply 10 sends back to the matching device 30 a control state flag indicating a current control state (i.e., information indicating whether a modulation operation for IMD control is being performed).

<Internal Configuration Example of Source Power Supply 10>

Figure 2:
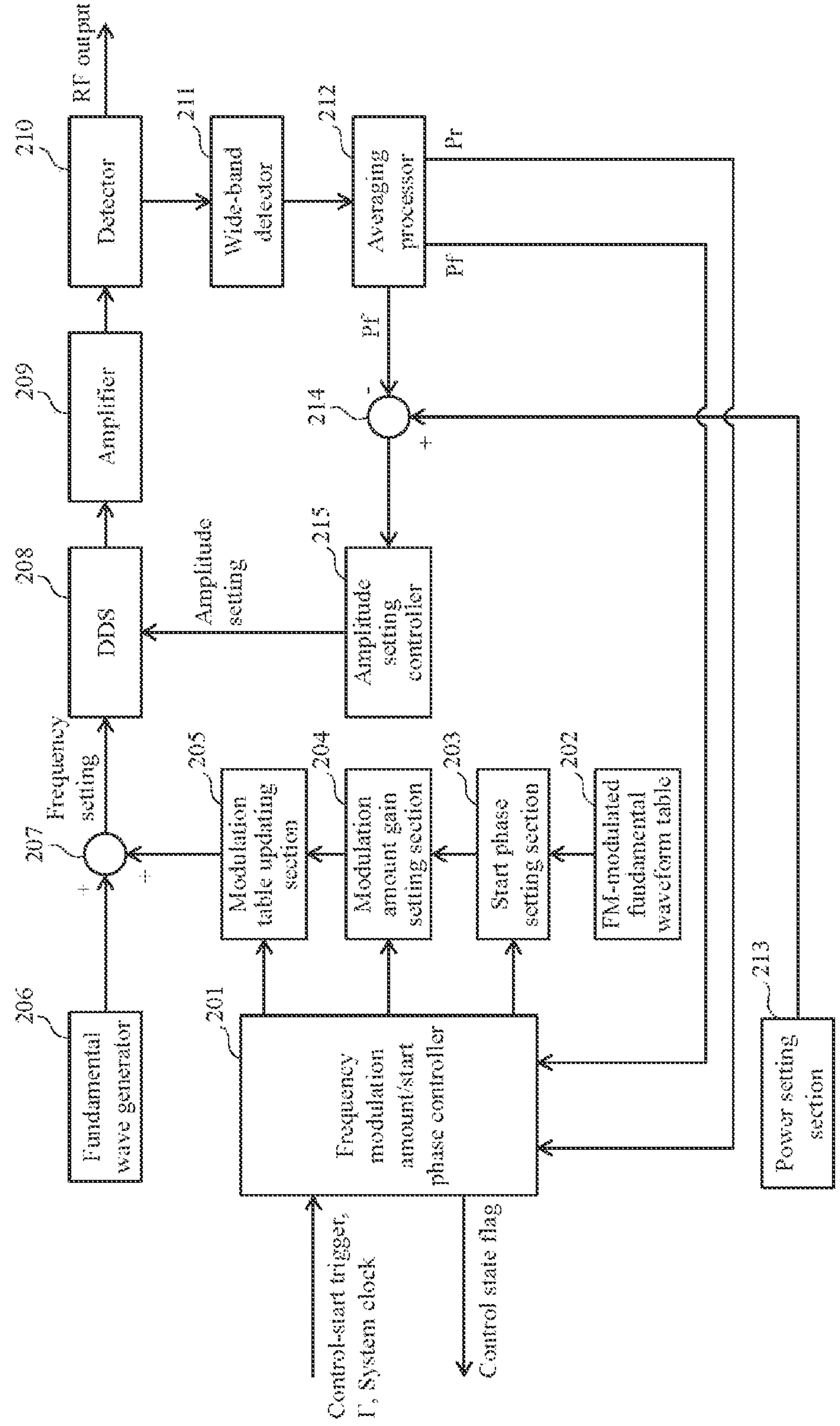
FIG. 2 illustrates an internal configuration example of a source power supply 10 according to the present embodiment.

FIG. 2 illustrates an internal configuration example of the source power supply 10 according to the present embodiment. As illustrated in FIG. 2, the source power supply 10 includes a frequency modulation amount/start phase controller 201, an FM-modulated fundamental waveform table 202, a start phase setting section 203, a modulation amount gain setting section 204, a modulation table updating section 205, a fundamental wave generator 206, a summing section (modulator) 207, a digital direct synthesizer (DDS) 208, an amplifier 209, a detector 210, a wide-band detector 211, an averaging processor 212, a power setting section 213, a subtractor 214, and an amplitude setting controller 215.

The frequency modulation amount/start phase controller 201 receives a control-start trigger (timing signal), a reflection coefficient, and a system clock from the matching device 30 and instructs the start phase setting section 203 and the modulation amount gain setting section 204 to set a start phase or a modulation amount gain (a value indicating a gain control ratio in a modulation range (for example, ±1.2 MHz)). In addition, the frequency modulation amount/start phase controller 201 transmits to the matching device 30, as a control state flag, start and end of the FM modulation operation related to IMD reduction on the source power supply 10 side.

The FM-modulated fundamental waveform table (memory) 202 is, for example, a table storing a waveform obtained by modulating a waveform in a range of 40.68 MHz±0.2 MHz at 400 kHz, and outputs an FM-modulated fundamental waveform in accordance with an instruction from the frequency modulation amount/start phase controller 201. The start phase setting section 203 sets a start phase of the FM-modulated fundamental waveform. The modulation amount gain setting section 204 sets a modulation amount gain of the FM-modulated fundamental waveform. The modulation table updating section 205 updates the value of the modulation amount gain and the value of the start phase in the FM modulation table that are currently being used for FM modulation.

The fundamental wave generator 206 generates a fundamental wave signal to be subjected to FM modulation, the signal comprising a fundamental wave (for example, 40.68 MHz) of the source power supply 10. The summing section (modulator) 207 performs FM modulation by reflecting the modulation amount gain and start phase from the modulation table updating section 205 on the fundamental wave signal from the fundamental wave generator 206 (for example, a waveform in the range of 49.68 MHz±1.2 MHz is FM modulated at 400 kHz). The DDS (Digital Direct Synthesizer) 208 A/D converts the FM-modulated signal and outputs it as a high-frequency signal. The amplifier 209 amplifies the high-frequency signal (FM-modulated signal) and provides a high-frequency power as an RF output to the matching device 30. In the following, the high-frequency power to be output may be referred to as a forward wave power Pf1. Also, the voltage component of the forward wave power Pf1 may be referred to as a forward wave voltage Vf1. Similarly, a high-frequency power reflected from the plasma load 40 side may be referred to as a reflected wave power Pr1. The voltage component of the reflected wave power Pr1 may be referred to as a reflected wave voltage Vr2.

The detector 210 detects the forward wave voltage Vf1 from the amplifier 209 and outputs a forward wave voltage detection signal Vf11 as a detection signal, and also detects the reflected wave power Pr1 reflected from the plasma load 40 side via the matching device 30 and outputs a reflected wave voltage detection signal Vr11 as a detection signal. The detector 210 outputs the detected forward wave voltage detection signal Vf11 and reflected wave voltage detection signal Vr11 to the wide-band detector 211.

The wide-band detector 211 serves as a filter for allowing a desired frequency component to pass therethrough, and through for example superheterodyne operation and filtering processing, passes a forward wave voltage detection signal Vf12 and a reflected wave voltage detection signal Vr12, which are respectively a desired component of the forward wave voltage detection signal Vf11 and a desired component of the reflected wave voltage detection signal Vr11, and outputs them to the averaging processor 212.

The averaging processor 212 calculates a forward wave power Pf1 based on the forward wave voltage detection signal Vf12 and also calculates a reflected wave power Pr1 based on the reflected wave voltage detection signal Vr12. For example, the averaging processor 212 can calculate the forward wave power Pf1 from Vf2 ^ 2/R (where R is a gain corresponding to a resistance). The averaging processor 212 can also calculate the reflected wave power Pr1 in the same manner. It should be noted that in the above expression, Vf2 represents a magnitude of the forward wave voltage detection signal Vf12. It is needless to mention that Vf2 will be multiplied by a gain for conversion to an actual power value.

The averaging processor 212 accumulates each of the calculated forward wave power Pf1 and reflected wave power Pr1 in a predetermined period. Furthermore, the averaging processor 212 averages each of the forward wave power Pf1 and the reflected wave power Pr1 for the predetermined period. The averaging processor 212 outputs an average power (a moving average for each predetermined period) of the forward wave power Pf1 to the subtractor 214. In addition, the averaging processor 212 outputs an average power of the forward wave power Pf1 and an average power of the reflected wave power Pr1 to the frequency modulation amount/start phase controller 201. Although the above description shows an example of calculating powers based on voltages and then performing averaging processing, the averaging processor 212 may calculate powers after the averaging processing on the voltages.

The power setting section 213 outputs a target power setting value. The subtractor 214 calculates a deviation between the target power setting value and the detected forward wave power Pf1 (an output value of the averaging processor 212) and outputs the deviation to the amplitude setting controller 215. The amplitude setting controller 215 sets an amplitude value for FM modulation based on the amount of deviation calculated by the subtractor 214.

The frequency modulation amount/start phase controller 201 causes the average values of the forward wave power Pf1 and the reflected wave power Pr1 (the moving averages for each predetermined period) that have been output from the averaging processor 212 to be stored in an internal memory (not illustrated). Further, the frequency modulation amount/start phase controller 201, if the reflected wave power Pr1 has not been acquired with respect to all of previously set start phase setting values and modulation amount gain setting values, controls the start phase setting section 203 or the modulation amount gain setting section 204 to modify the start phase value or the modulation amount gain. In addition, the frequency modulation amount/start phase controller 201 determines a start phase setting value and a modulation amount gain setting value corresponding to a minimum reflected wave power Pr1 among the reflected wave powers Pr1 corresponding to all the start phase setting values and modulation amount gain setting values, and fixes the subsequent FM modulation parameters (modulation amount gain setting value and start phase setting value). Although the above description shows an example of reducing the reflected wave power Pr1, the reflection coefficient may be reduced.

<Internal Configuration Example of Matching Device 30>

The matching device 30 is a device that plays a central role in the power supply system 1 of the present embodiment. The matching device 30 has a knowledge that outputs are supplied from both of the bias power supply (a low-frequency side power supply operating at 400 kHz, for example) 20 and the source power supply (a high-frequency side power supply operating at 40 MHz, for example) (including the timings of starting the supply). Once an output is started to be supplied from the bias power supply 20, the matching device 30 transmits a control-start trigger to the source power supply 10 to notify the source power supply 10 of the timing of starting an IMD reduction process so that the source power supply 10 starts a modulation operation (an IMD reduction process) for IMD reduction. However, since the matching device 30 cannot confirm that the IMD reduction process has actually been started only by transmitting the control-start trigger to the source power supply 10, the matching device 30 is configured to acquire a control state flag from the source power supply 10.

Figure 3:
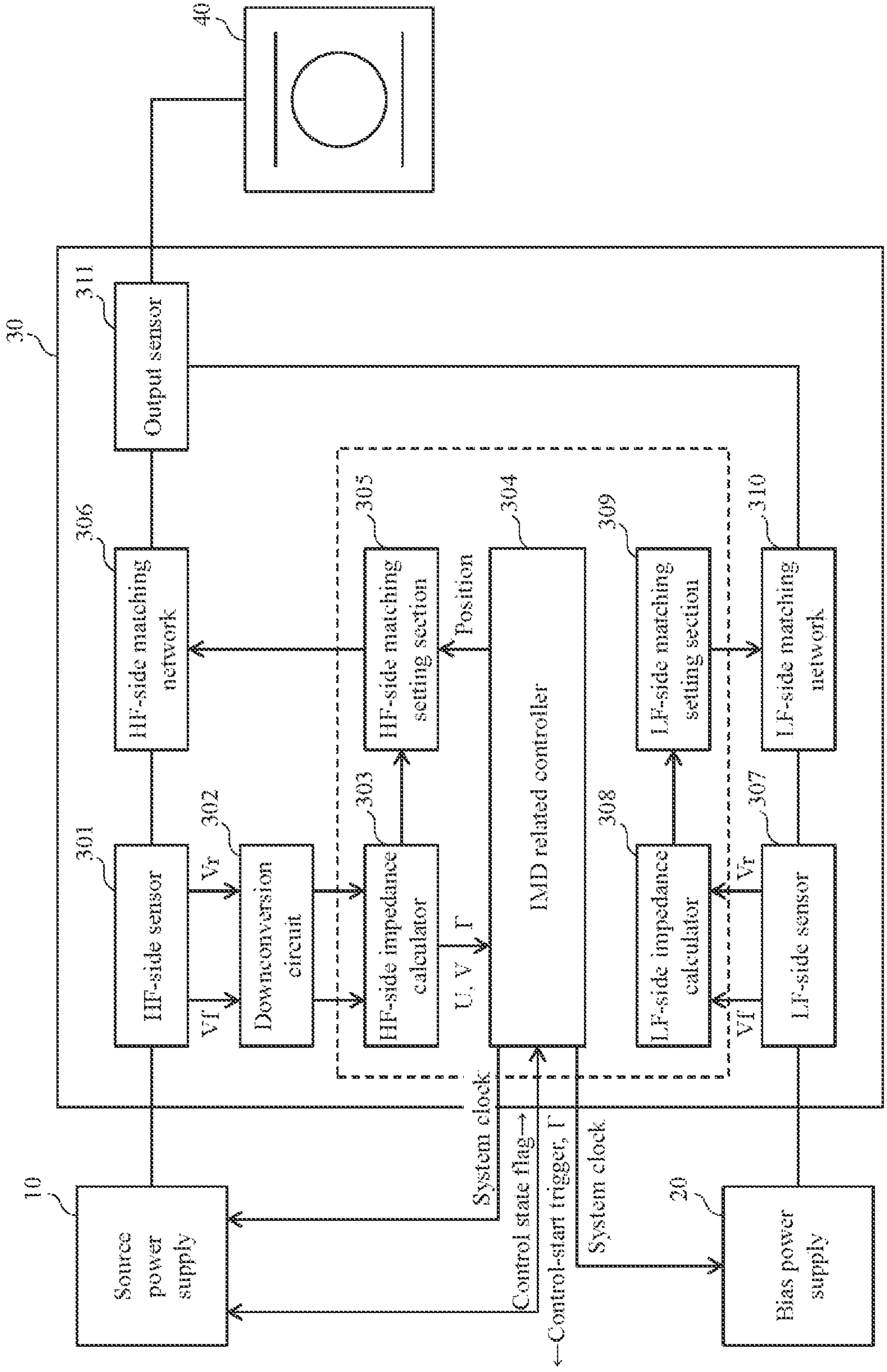
FIG. 3 illustrates an internal configuration example of a matching device 30 according to the present embodiment.

FIG. 3 illustrates an internal configuration example of the matching device 30 according to the present embodiment. The matching device 30 includes an HF-side sensor 301, a downconversion circuit 302, an HF-side impedance calculator 303, an IMD related controller 304, an HF-side matching setting section 305, an HF-side matching network 306, an LF-side sensor 307, an LF-side impedance calculator 308, an LF-side matching setting section 309, an LF-side matching network 310, and an output sensor 311.

In the present embodiment, the HF-side sensor 301, the downconversion circuit 302, the HF-side impedance calculator 303, the IMD related controller 304, the HF-side matching setting section 305, and the HF-side matching network 306 form a first matching part. The LF-side sensor 307, the LF-side impedance calculator 308, the LF-side matching setting section 309, the LF-side matching network 310, and the IMD related controller 304 form a second matching part.

The HF-side sensor 301 detects a forward wave voltage Vf1 from the forward wave power Pf1 supplied from the source (HF) power supply 10 and a reflected wave voltage Vr1 from the reflected wave power Pr1 reflected from the plasma load 40 side, and provides them to the downconversion circuit 302. The HF-side sensor 301 provides the forward wave power Pf1 on the HF side from the source power supply 10 to the HF-side matching network 306.

The downconversion circuit 302 converts the operation frequency to a lower level (for example, reduces from 40 MHz to 12 MHz) considering the processing speed in determining an impedance locus.

The HF-side impedance calculator 303 computes impedance (Vr/Vf) on the HF side from the averaged outputs (Vf·sin θ, Vf·cos θ, Vr·sin θ, and Vr·cos θ), converts it into a reflection coefficient (vector components U, V) and then provides them to the IMD related controller 304. It should be noted that the operation of the HF-side impedance calculator 303 will be described in detail later (see step 409 of FIG. 4B).

The IMD related controller 304 provides a system clock to the source power supply 10 and the bias power supply 20, provides a control start trigger, a reflection coefficient F, and the like to the source power supply 10, and directly receives from the source power supply 10 a control state flag indicating that the source power supply 10 has started and finished the IMD reduction process. In addition, using the reflection coefficient (vector components U, V), the IMD related controller 304 calculates a position of the matching device (for example, acquires a position of the variable capacitor corresponding to U and V with reference to an S parameter table) and provides the calculated position to the HF-side matching setting section 305.

The HF-side matching setting section 305 changes the value of the variable capacitor included in the HF-side matching network 306 based on the position of the variable capacitor acquired from the IMD related controller 304.

The HF-side matching network 306 achieves matching between the input side (source power supply 10 side) and the output side (plasma load 40 side) and provides the forward wave power Pf1 supplied from the source power supply 10 to the output sensor 311.

The LF-side sensor 307 detects a forward wave voltage Vf1 from the forward wave power Pf2 supplied from the bias (LF) power supply 20 and a reflected wave voltage Vr2 from the reflected wave power Pr2 reflected from the plasma load 40 side, and provides them to the LF-side impedance calculator 308. The LF-side sensor 307 provides the forward wave power Pf2 on the LF side supplied from the bias power supply 20 to the LF-side matching network 310.

Using the forward wave voltage Vf2 and the reflected wave voltage Vr2 on the LF side, the LF-side impedance calculator 308 computes impedance (Vr/Vf) on the LF side, and provides it to the LF-side matching setting section 309. The LF-side matching setting section 309 calculates a position of the variable capacitor included in the LF-side matching network 310 based on the impedance value on the LF side, and changes the value of the variable capacitor in the LF-side matching network 310 based on the calculated position.

The LF-side matching network 310 achieves matching between the input side (bias power supply 20 side) and the output side (plasma load 40 side) and provides the forward wave power Pf2 supplied from the bias power supply 20 to the output sensor 311.

The output sensor 311 provides the plasma load 40 with the forward wave power Pf1 (source power) from the source power supply 10 and the forward wave power Pf2 (bias power) from the bias power supply 20 in a superimposed manner.

<Details of IMD Reduction (Suppression) Process in Entire Power Supply System 1>

Figure 4A:
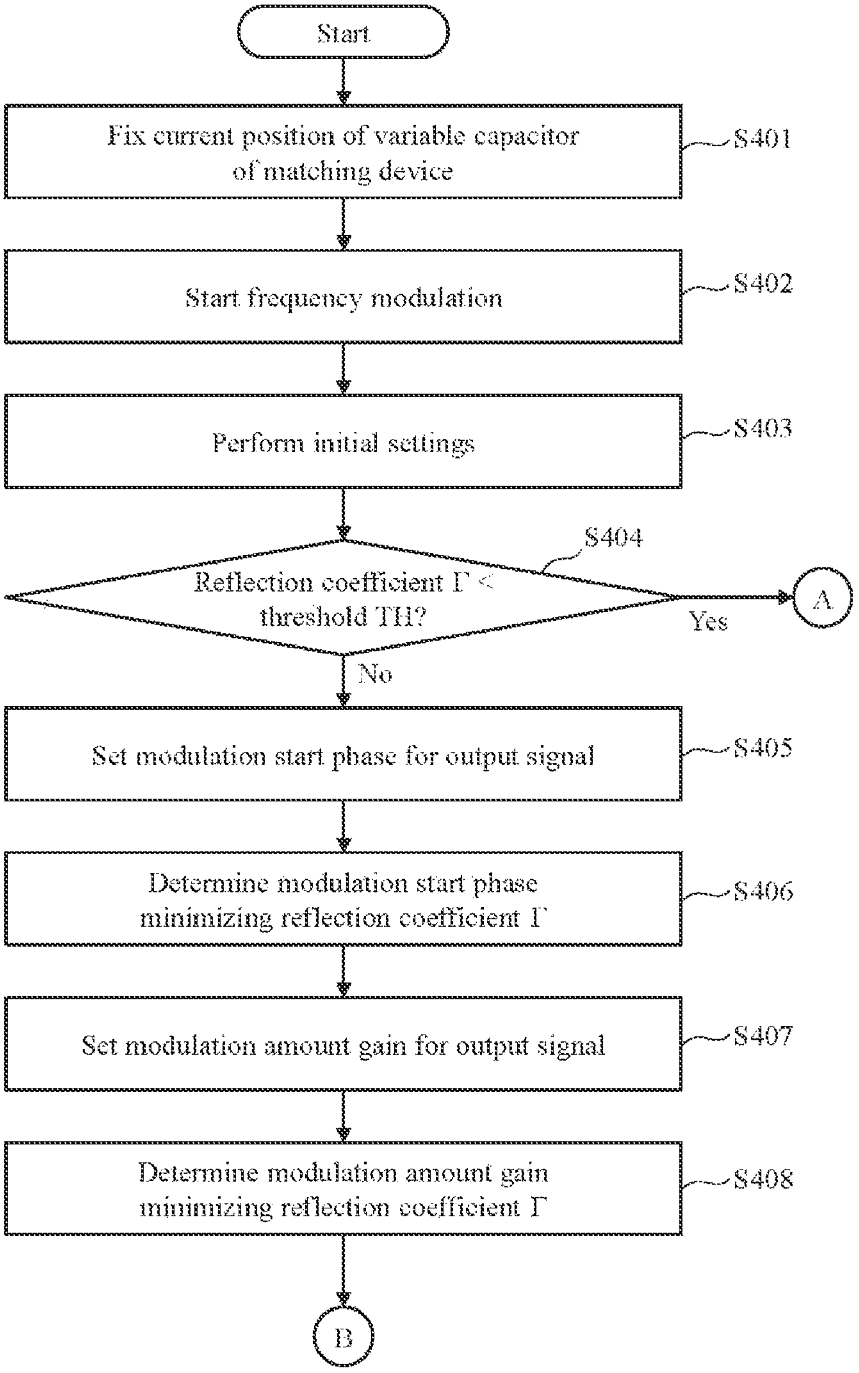
FIG. 4A is a flowchart (first half) for describing in detail an IMD reduction (suppression) process in the entire power supply system 1 according to the present embodiment.
Figure 4B:
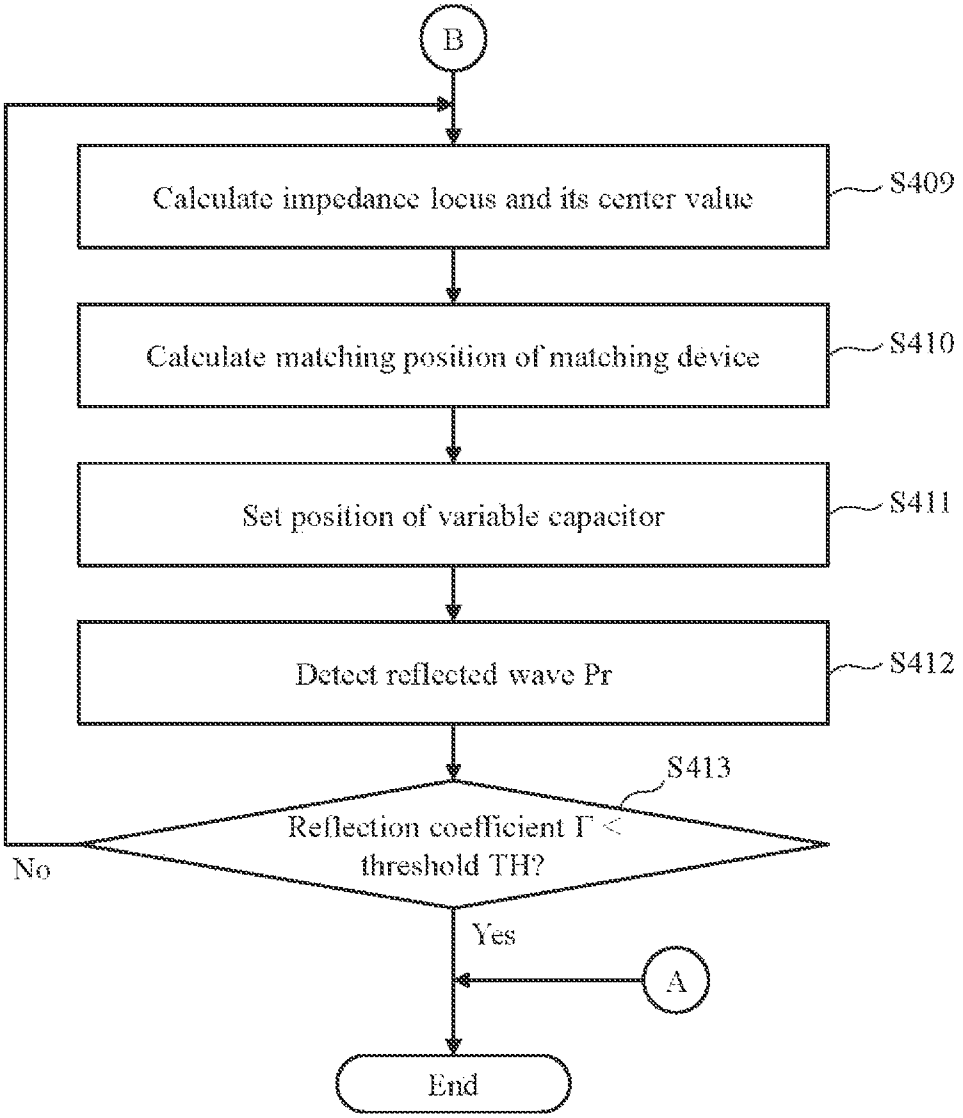
FIG. 4B is a flowchart (latter half) for describing in detail the IMD reduction (suppression) process in the entire power supply system 1 according to the present embodiment.

FIG. 4A and FIG. 4B are flowcharts for describing in detail the IMD reduction (suppression) process in the entire power supply system 1 according to the present embodiment.

(i) Step 401

The IMD related controller 304 of the matching device 30 provides a system clock to the source power supply 10 and the bias power supply 20. In addition, as a condition for starting an IMD reduction process, at a timing when the IMD related controller 304 detects that a high-frequency power is output from the bias power supply 20 operating at 400 kHz, for example, and then provided to the load, the IMD related controller 304 executes the IMD reduction process. That is, the IMD related controller 304, if an output from the bias power supply 20 is detected, instructs the HF-side matching setting section 305 to fix the position of the matching device, and sets the value of the variable capacitor in the HF-side matching network 306 to a predetermined fixed value. In addition, the IMD related controller 304 transmits to the source power supply 10 a control-start trigger that is an instruction to start a modulation operation.

(ii) Steps 402 and 403

Upon reception of a system clock and a control-start trigger signal provided from the matching device 30, the frequency modulation amount/start phase controller 201 of the source power supply 10 instructs the start phase setting section 203 to set a start phase (initial value). In response to the instruction, the start phase setting section 203 reads from the FM-modulated fundamental waveform table 202 a fundamental waveform (for example, a waveform obtained by modulating a waveform in a range of 40.68 MHz±2 MHz at a frequency of 400 kHz), sets an arbitrary start phase (initial value), and outputs the fundamental waveform reflecting the start phase to the modulation amount gain setting section 204.

In response to an instruction for setting a modulation amount gain from the frequency modulation amount/start phase controller 201, and upon reception of the fundamental waveform reflecting the start phase from the start phase setting section 203, the modulation amount gain setting section 204 sets an arbitrary modulation amount gain (initial value), and outputs a fundamental waveform reflecting the modulation amount gain to the modulation table updating section 205.

Then, the summing section (modulator) 207 performs FM modulation by reflecting an initial setting fundamental wave output from the modulation table updating section 205 on a fundamental wave output from the fundamental wave generator 206 (for example, the fundamental wave of 40.68 MHz in the source power supply 10), and provides an output to the DDS 208.

(iii) Step 404

The detector 210 detects the high-frequency output (the forward wave power Pf1: the output of the amplifier 209) that has been obtained by modulation with the modulation amount gain (initial value) and the start phase (initial value) and through amplification. The detector 210 also detects the reflected wave power Pr1 from the plasma load 40 side and outputs the forward wave power Pf1 and the reflected wave power Pr1 to the wide-band detector 211. The wide-band detector 211 detects the forward wave power Pf1 and the reflected wave power Pr1 for a predetermined number of times of detection (or that have been detected in a predetermined period). Then, the averaging processor 212 calculates the moving average values.

Furthermore, the frequency modulation amount/start phase controller 201 determines whether the reflected wave power Pr1 (reflection coefficient Γ) acquired from the averaging processor 212 is smaller than a predetermined threshold TH. If the reflected wave power Pr1 (reflection coefficient Γ) is smaller than the threshold TH (YES in step 404: or if the reflected wave power Pr1 (reflection coefficient Γ) is "equal to or smaller than the threshold TH"), the IMD suppression process ends. In contrast, if the reflected wave power Pr1 (reflection coefficient Γ) is equal to or larger than the threshold TH (NO in step 404: or if the reflected wave power Pr1 (reflection coefficient Γ) is "larger than the threshold TH"), the process goes to step 405.

(iv) Step 405

The frequency modulation amount/start phase controller 201 modifies the start phase from the previous value by a predetermined value (wherein the modifying step amount is determined in advance). At this time, the modulation amount gain is fixed to the same value as before, and the modulation table updating section 205 outputs the fundamental wave with the modified start phase to the summing section (modulator) 207. The summing section (modulator) 207 performs FM modulation by reflecting the fundamental wave (with the modified start phase) output from the modulation table updating section 205 on the fundamental wave output from the fundamental wave generator 206, and provides an output to the DDS 208.

The detector 210 detects the high-frequency output (the forward wave power Pf1: the output of the amplifier 209) that has been obtained by modulation of the fundamental wave with the modulation amount gain (initial value) and the modified start phase and through amplification. The detector 210 also detects the reflected wave power Pr1 (reflection coefficient Γ) from the plasma load 40 side, and outputs the forward wave power Pf1 and the reflected wave power Pr1 to the wide-band detector 211. Then, the wide-band detector 211 detects the forward wave power Pf1 and the wave power Pr1 for a predetermined number of times of detection (or that have been detected in a predetermined period). Then, the averaging processor 212 calculates the moving average values.

The frequency modulation amount/start phase controller 201 repeats the above-described operation for all values of the start phase (wherein the width of change in the start phase (variation width) is determined in advance), and acquires reflected wave powers Pr1 (reflection coefficients Γ) corresponding to the values of the start phase. It should be noted that reflected wave powers Pr1 need not be determined for "all" values of the start phase within the variation width. Reflected wave powers Pr1 corresponding to a plurality of start phase values within a range of the variation width of the start phase may be determined.

(v) Step 406

The frequency modulation amount/start phase controller 201 extracts a minimum reflected wave power Pr1 (reflection coefficient Γ) from a plurality of reflected wave powers Pr1 (reflection coefficients Γ) obtained in step 405, and acquires the value of the start phase corresponding thereto. In the subsequent processes, the frequency modulation amount/start phase controller 201 fixes the start phase to the acquired value. When the minimum value of the reflected wave power Pr1 is extracted, the forward wave power Pf1 is not required when performing the processing in the frequency modulation amount/start phase controller 201. In addition, when the minimum value of the reflection coefficient r is extracted, the frequency modulation amount/start phase controller 201 will have the functionality to calculate the reflection coefficient. In this embodiment, the frequency modulation amount/start phase controller 201 calculates the reflection coefficient Γ according to Expression (1):

$$\Gamma=\sqrt{(Pr/Pf)} \tag{1}$$

Whether the minimum value of the reflected wave power Pr1 is extracted or the minimum value of the reflection coefficient Γ is extracted, the concept of extracting the minimum value of the reflected wave power Pr1 is the same. In addition, the reflection coefficient may be calculated based on the forward wave voltage and the reflected wave voltage, or may be calculated according to another scheme. The detector 210 may be any detector capable of detecting desired information.

(vi) Step 407

The frequency modulation amount/start phase controller 201 modifies the modulation amount gain from the previous value by a predetermined value (wherein the modifying step amount is determined in advance). At this time, the value of the start phase is fixed to the value determined in step 406 as described above.

The modulation table updating section 205 outputs a fundamental wave having the fixed value of start phase and the modified modulation amount gain to the summing section (modulator) 207. The summing section (modulator) 207 performs FM modulation by reflecting the fundamental wave (having the fixed start phase and the modified modulation amount gain) output from the modulation table updating section 205 on the fundamental wave output from the fundamental wave generator 206, and provides an output to the DDS 208. The detector 210 detects the high-frequency output (the forward wave power Pf1: the output of the amplifier 209) that has been obtained by modulation of the fundamental wave with the fixed start phase and the modified modulation amount gain and through amplification. The detector 210 also detects the reflected wave power Pr1 from the matching device 30, and then outputs the forward wave power Pf1 and the reflected wave power Pr1 to the wide-band detector 211. The wide-band detector 211 detects the forward wave power Pf1 and the reflected wave power Pr1 for a predetermined number of times of detection (or that have been detected in a predetermined period). Then, the averaging processor 212 calculates the moving average values and provides them to the frequency modulation amount/start phase controller 201.

The frequency modulation amount/start phase controller 201 repeats the above-described operation for all values of the modulation amount gain (wherein the width of change in the modulation amount gain (variation width) is determined in advance), and acquires reflected wave powers Pr1 (reflection coefficients Γ) corresponding to the values of the modulation amount gain. It should be noted that reflected wave powers Pr1 need not be determined for "all" values of the modulation amount gain within the variation width. Reflected wave powers Pr1 corresponding to a plurality of modulation amount gains within a range of the variation width of the modulation amount gain may be determined. In this case, within what range the modulation amount gain should be changed may be determined in advance.

(vii) Step 408

The frequency modulation amount/start phase controller 201 extracts a minimum reflected wave power Pr1 from a plurality of reflected wave powers Pr1 obtained in step 407, and acquires the value of the modulation amount gain corresponding thereto. The frequency modulation amount/start phase controller 201 then uses the start phase obtained in step 406 and the modulation amount gain obtained in step 406 for the subsequent modulation operation (completion of matching).

In the foregoing, the minimum reflected wave power Pr1 is extracted from a plurality of reflected wave powers Pr1, and the value of the start phase corresponding to the minimum reflected wave power Pr1 is acquired. However, this is not a limitation, and a reflection coefficient may be used, as in step 406 for example.

(xiii) Step 409

The HF-side impedance calculator 303 of the matching device 30 acquires a forward wave voltage Vf1 and a reflected wave voltage Vr2 and then calculates an impedance locus and its center value. The following describes the details of this processing.

First, the HF-side impedance calculator 303 acquires, from the HF-side sensor 301, a voltage component Vf1 (forward wave voltage) of the forward wave power Pf1 and a voltage component Vr1 (reflected wave voltage) of the reflected wave power Pr1.

Next, the HF-side impedance calculator 303 generates (oscillates) a signal (cosine and sine components) at an HF frequency f (for example, 40.68 MHz) and multiplies, using a multiplier, the forward wave voltage Vf1 from the HF-side sensor 301 by a real component ($\cos(2\pi f \cdot ts \cdot k)$) of an oscillation output. In addition, the HF-side impedance calculator 303 multiplies, using a multiplier, the forward wave voltage Vf1 from the HF-side sensor 301 by an imaginary component ($\sin(2\pi f \cdot ts \cdot k)$) of the oscillation output. Furthermore, using a multiplier, the HF-side impedance calculator 303 multiplies the reflected wave voltage Vr1 from the HF-side sensor 301 by a real component ($\cos(2\pi f \cdot ts \cdot k)$) of the oscillation output and multiplies the reflected wave voltage Vr1 from the HF-side sensor 301 by an imaginary component ($\sin(2\pi f \cdot ts \cdot k)$) of the oscillation output. Through the above operation, detection values (the forward wave voltage Vf1 and the reflected wave voltage Vr1) of the HF-side sensor 301 are complexified. That is, the HF-side impedance calculator 303 has a complex filter therein. Vf and Vr are transformed into $Vf1 = Vf1\{\cos(2\pi f \cdot ts \cdot k) - j \cdot \sin(2\pi f \cdot ts \cdot k)\}$, $Vr1 = Vr1\{\cos(2\pi f \cdot ts \cdot k) - j \cdot \sin(2\pi f \cdot ts \cdot k)\}$, respectively, by the complex filter.

The HF-side impedance calculator 303 then averages each of the complexified forward wave voltage and reflected wave voltage by the HF frequency (the fundamental frequency of the source (high-frequency) power supply 10). Specifically, the HF-side impedance calculator 303 averages each of the complexified Vf1 and Vr1 for one cycle of a sample frequency (for example, 400 kHz) by an HF period (for example, 40.68 MHz). Thus, the HF-side impedance calculator 303 calculates an amplitude value and a phase value for one waveform of an LF period (400 kHz).

Furthermore, the HF-side impedance calculator 303 calculates an impedance value using the averaged forward wave voltage ($Vf1 \cdot \cos\theta$ and $Vf1 \cdot \sin\theta$) and the averaged reflected wave voltage ($Vr1 \cdot \cos\theta$ and $Vr1 \cdot \sin\theta$). Specifically, the HF-side impedance calculator 303 determines an impedance value (Vr1/Vf1) using the voltage values obtained through the averaging for the one waveform of the LF period by the HF period. This means that a reflection coefficient in each HF period has been calculated through such operation, and accordingly, vectors (vectors (U, V)) of the reflection coefficient can be obtained by the number of a result of dividing the LF period (400 kHz cycle) by the HF period (40.68 MHz cycle). That is, plot values for the number obtained by (400 kHz cycle÷40.68 MHz cycle) can be obtained. Then, in a manner corresponding to the reflection coefficient (vectors; plots) for the number obtained by (LF frequency cycle/HF frequency cycle), the HF-side impedance calculator 303 determines and outputs an impedance locus (i.e., the HF-side impedance calculator 303 can acquire impedances for the number obtained by (LF frequency/HF frequency) in one cycle of the LF frequency) and its center value.

(ix) Step 410

The IMD related controller 304 of the matching device 30 receives the above vectors (vectors (U, V)) of the reflection coefficient and the reflection coefficient Γ from the HF-side impedance calculator 303, and determines a matching position of the variable capacitor in the HF-side matching network 306. Specifically, with reference to the S parameter table (not illustrated), the IMD related controller 304 acquires information about the position of the variable capacitor corresponding to the vectors (U, V) of the reflection coefficient. In step 410, the IMD related controller 304 can determine a more appropriate position of the variable capacitor that has been fixed. The information about the determined position of the variable capacitor will be provided from the IMD related controller 304 to the HF-side matching setting section 305.

(x) Step 411

The HF-side matching setting section 305 of the matching device 30 sets the position of the variable capacitor in the HF-side matching network 306 based on the information about the position of the variable capacitor received from the IMD related controller 304.

(xi) Step 412

The HF-side sensor 301 detects a reflected wave power Pr1 from the plasma load 40.

(xii) Step 413

The IMD related controller 304 determines whether the reflected wave power Pr1 (reflection coefficient Γ) is smaller than the predetermined threshold TH. If the reflected wave power Pr1 (reflection coefficient Γ) is smaller than the threshold TH (YES in step 413: or if the reflected wave power Pr1 (reflection coefficient Γ) is "equal to or smaller than the threshold TH"), the IMD suppression process is completed. In contrast, if the reflected wave power Pr1 (reflection coefficient Γ) is equal to or larger than the threshold TH (NO in step 413: or if the reflected wave power Pr1 (reflection coefficient Γ) is "larger than the threshold TH"), the process goes back to step 409.

<Changes in Reflected Wave Power Pr1 Before and After IMD Suppression Process>

Figure 5A:
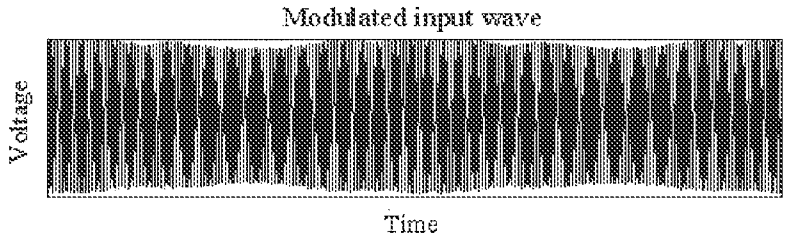
FIGS. 5A, 5B, and 5C illustrate changes (examples) in a reflected wave power Pr1 before and after IMD suppression.
Figure 5B:
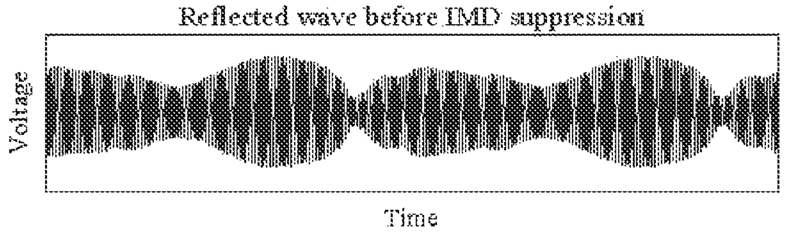
Figure 5C:
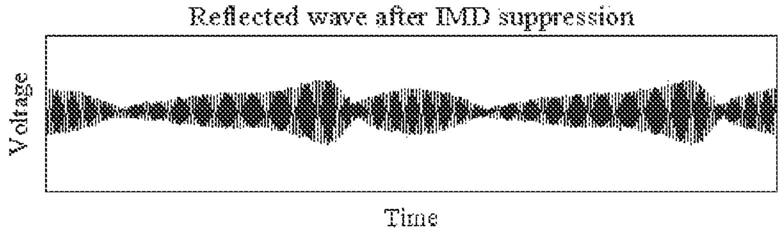

FIGS. 5A, 5B, and 5C illustrate changes (examples) in the reflected wave power Pr1 before and after IMD suppression. FIG. 5A illustrates an input wave that has been modulated; FIG. 5B illustrates a reflected wave before the IMD suppression process (before matching by the matching device 30); and FIG. 5C illustrates the reflected wave power Pr1 after the IMD suppression process (after matching by the matching device 30).

As can be seen from the comparison of FIG. 5B and FIG. 5C, the variation in the reflected wave power Pr1 (reflected wave voltage Vr) is suppressed by the IMD suppression process.

<Changes in Impedance Locus Before and After IMD Suppression Process>

Figure 6A:
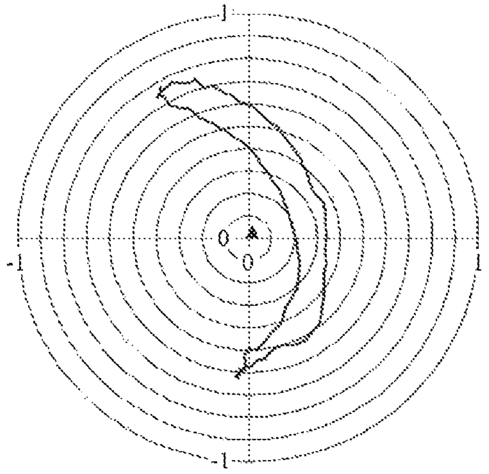
FIGS. 6A and 6B illustrate an impedance locus (example) before and after the IMD suppression process.
Figure 6B:
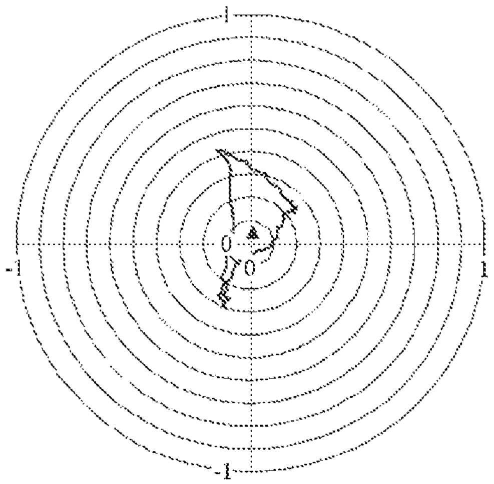

FIGS. 6A and 6B illustrate an impedance locus (example) before and after the IMD suppression process. FIG. 6A illustrates an impedance locus before the IMD suppression process and FIG. 6B illustrates an impedance locus after the IMD suppression process.

When an impedance value is calculated while excluding IMD components (reflection coefficient components), the impedance locus in narrow band matching may include values (plot values) that are far from the center (the center of the Smith chart). Vector-averaging such values will place the impedance locus around the center even if IMD suppression is not being performed.

In practice, however, such an impedance locus will not fit into the center (i.e., the impedance locus extends up to the point around +0.8 at maximum) as illustrated in FIG. 6A. As such, it cannot be said that matching is achieved optimally. Thus, the high-frequency output (RF output) of the source power supply 10 is FM-modulated (for example, FM-modulated at the LF frequency) and provided to the matching device 30 for IMD suppression, so that the impedance locus is placed around the center. While the impedance locus is fit into the center (while IMD is being suppressed), each of the forward wave voltage Vf1 and the reflected wave voltage Vr1 is averaged. In this way, both of the impedance locus obtained without the averaging processing and the impedance locus obtained with the averaging processing can be placed around the center (see FIG. 6B).

When the impedance locus (i.e., the locus that is not fit around the center) as illustrated in FIG. 6A, for example, is obtained without performing FM modulation, in order to achieve impedance matching, FM modulation is performed first. From the comparison of the impedance locus obtained after FM modulation and the impedance locus obtained before FM modulation, it can be found that the shape of the impedance locus changes. If the locus is deviated from the matching condition (an impedance value of 50Ω), the deviation is corrected by the matching device 30, thereby achieving a state in which IMD is most suppressed.

As described above, generating and outputting (presenting) an impedance locus allows an operator (user) to determine whether to perform FM modulation and provide a high-frequency output (RF output) to the plasma load 40.

CONCLUSION (i) In the high-frequency power supply system of the present embodiment, a matching device including a first matching part configured to acquire a bias power and a frequency-modulated high-frequency output and achieve matching between an impedance on the source power supply side and an impedance on the load side generates a trigger signal having the same frequency as a second frequency of the bias power and serving as a timing signal, and provides the trigger signal to the source power supply. Then, the source power supply performs frequency modulation in response to the trigger signal. In this way, the source power supply can perform frequency modulation without acquiring information from the bias power supply, allowing simplification of the process of suppressing an increase in the reflected wave power Pr1 due to IMD (reduction of the number of processing operations). Specifically, the source power supply, in response to the trigger signal, detects a reflected wave while causing each of a modulation start phase and a modulation amount gain to be varied, and determines an optimum modulation start phase and an optimum modulation amount gain that minimize the reflected wave. Upon reception of a bias power from the bias power supply, the matching device generates a trigger signal, and provides the trigger signal to the source power supply. Furthermore, the matching device detects a reflected wave from the load, and provides the information about the reflected wave to the source power supply.

Meanwhile, the source power supply provides the matching device with information indicating whether a frequency modulation operation has been started in response to a trigger signal or whether determination of an optimum modulation start phase and an optimum modulation amount gain has been completed. In this way, the matching device can know whether the IMD reduction process has been performed on the source power supply side. After the source power supply determines the optimum modulation start phase and the optimum modulation amount gain (performs the IMD reduction process), the matching device calculates reflection coefficient vectors and sets the matching position of the matching device based on the calculated reflection coefficient vectors. In this way, it is possible to determine an optimum matching position. Furthermore, the matching device calculates and outputs an impedance locus based on a forward wave from the source power supply and a reflected wave from the load.

The above-described control is performed with a common system clock provided from the matching device 30 to the source power supply (first power supply) 10 and the bias power supply (second power supply) 20. This allows a timing of frequency modulation control in the source power supply to be synchronous with a second frequency. Thus, the above-described control has no adverse effect caused by the system clock in the first power supply being out of synchronization with the system clock in the second power supply, and can perform accurate frequency modulation control.

(ii) The functions of the present embodiment may also be implemented by software program code. In this case, a storage medium with the program code recorded thereon may be provided to a system or device, and a computer (or CPU or MPU) of the system or device may read the program code stored on the storage medium. In this case, the program code per se that has been read from the storage medium will provide the functions of the embodiment described above, and the program code per se and the storage medium having the same stored thereon will constitute the present disclosure. Exemplary storage media for supplying such program code include a flexible disc, a CD-ROM, a DVD-ROM, a hard disk, an optical disk, a magneto-optical disk, a CD-R, magnetic tape, a nonvolatile memory card, and a ROM.

Also, an operating system (OS) or the like running on a computer may perform some or all of actual processes based on an instruction of the program code, and the functions of the embodiment described above may be implemented by the processes. Further, after the program code read from the storage medium has been written to a memory on a computer, a CPU or the like of the computer may perform some or all of actual processes based on an instruction of the program code, and the functions of the embodiment described above may be implemented by the processes.

Further, software program code for implementing the functions of an embodiment may be delivered via a network and stored in a storage means, such as a hard disk or a memory of a system or device, or stored in a storage medium such as a CD-RW or a CD-R. In use, the program code may be read from the storage means or the storage medium and performed by a computer (or CPU or MPU) of the system or device.

The processes and techniques described herein are not in essence associated with any specific device. Various general-purpose devices may be used in accordance with the descriptions of the present disclosure. In some cases, it may be beneficial to construct a dedicated device for performing the techniques of the present disclosure.

Various embodiments may be formed by combining, as appropriate, a plurality of constituent elements disclosed herein. For example, some of the constituent elements disclosed in the present embodiment may be eliminated. Further, constituent elements from different embodiments may be combined, as appropriate. While the techniques of the present disclosure have been described with reference to a concrete embodiment, these are not intended as limiting the techniques of the present disclosure and are instead for illustrative purposes. It will be apparent to a person skilled in the art that hardware, software, and firmware may be combined in a number of appropriate ways to implement the techniques of the present disclosure. For example, software described may be implemented using a wide variety of programs or script languages, such as assembler, C/C ++, perl, Shell, PHP, Java (registered trademark), and the like.

Control lines and information lines that are illustrated with respect to the foregoing embodiment are those considered necessary for convenience of description, and do not necessarily represent all of control lines and information lines that are required in a product. All of the configurations may be interconnected.

What is claimed is:

1. A high-frequency power supply system for providing a high-frequency power to a connected load, the system comprising:

a first power supply configured to output a first high-frequency voltage having a first fundamental frequency so as to supply a first high-frequency power to the load;

a second power supply configured to output a second high-frequency voltage having a second fundamental frequency that is lower than the first fundamental frequency so as to supply a second high-frequency power to the load; and a matching device including a first matching part connected between the first power supply and the load and a second matching part connected between the second power supply and the load, wherein:

the matching device provides a system clock to each of the first power supply and the second power supply, the second power supply outputs a second high-frequency voltage at a control period determined based on the system clock provided from the matching device, and the first power supply outputs a first high-frequency voltage obtained by frequency modulation of a fundamental wave signal having a first fundamental frequency and through amplification, in each control period determined based on the system clock provided from the matching device.

2. The high-frequency power supply system according to claim 1, wherein frequency modulation in the first power supply is for performing frequency modulation on the fundamental wave signal with a signal for which a modulation start phase and a modulation amount gain are set.

3. The high-frequency power supply system according to claim 2, wherein the first power supply generates a trigger signal based on the system clock and, in response to the trigger signal, updates the modulation start phase and the modulation amount gain.

* * * * *